(12) United States Patent
Satoskar et al.

(10) Patent No.: US 9,813,814 B1
(45) Date of Patent: Nov. 7, 2017

(54) ENHANCING DYNAMIC RANGE BASED ON SPECTRAL CONTENT OF SIGNAL

(71) Applicant: Cirrus Logic International Semiconductor Ltd., Edinburgh (GB)

(72) Inventors: Aniruddha Satoskar, Austin, TX (US); Tejasvi Das, Austin, TX (US); Ku He, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/244,670

(22) Filed: Aug. 23, 2016

(51) Int. Cl.
| H04R 3/00 | (2006.01) |
| H04R 3/04 | (2006.01) |
| H03G 3/30 | (2006.01) |
| H03K 5/1536 | (2006.01) |

(52) U.S. Cl.
CPC .............. *H04R 3/04* (2013.01); *H03G 3/3005* (2013.01); *H03G 3/3089* (2013.01); *H03K 5/1536* (2013.01)

(58) Field of Classification Search
CPC ...... H04R 3/04; H03G 3/3089; H03G 3/3005; H03K 5/1536
See application file for complete search history.

(56) References Cited

U.S. PATENT DOCUMENTS

| 4,446,440 A | 5/1984 | Bell |
| 4,493,091 A | 1/1985 | Gundry |
| 4,890,107 A | 12/1989 | Pearce |
| 4,972,436 A | 11/1990 | Halim et al. |
| 4,999,628 A | 3/1991 | Kakubo et al. |
| 4,999,830 A | 3/1991 | Agazzi |
| 5,148,167 A | 9/1992 | Ribner |
| 5,198,814 A | 3/1993 | Ogawara et al. |

(Continued)

FOREIGN PATENT DOCUMENTS

| EP | 0966105 A2 | 12/1999 |
| EP | 1575164 A2 | 9/2005 |

(Continued)

OTHER PUBLICATIONS

Thaden, Rainer et al., A Loudspeaker Management System with FIR/IRR Filtering; AES 32nd International conference, Hillerod, Denmark, Sep. 21-23, 2007; pp. 1-12.

(Continued)

*Primary Examiner* — Muhammad N Edun
(74) *Attorney, Agent, or Firm* — Jackson Walker L.L.P.

(57) ABSTRACT

In accordance with embodiments of the present disclosure, an apparatus for providing an output signal to an audio transducer may include a signal path and a control circuit. The signal path may include an analog signal path portion having an audio input for receiving an analog signal, an audio output for providing an output signal, and a selectable analog gain, and configured to generate the output signal based on the analog signal and in conformity with the selectable analog gain and a digital path portion having a selectable digital gain and configured to receive a digital input signal and convert the digital input signal into the analog signal in conformity with the selectable digital gain. The control circuit may be configured to determine a spectral content of a signal indicative of the output signal and change the selectable digital gain and the selectable analog gain based on the spectral content.

22 Claims, 4 Drawing Sheets

(56) References Cited

U.S. PATENT DOCUMENTS

| | | |
|---|---|---|
| 5,321,758 A | 6/1994 | Charpentier et al. |
| 5,323,159 A | 6/1994 | Imamura et al. |
| 5,550,923 A | 8/1996 | Hotvet et al. |
| 5,600,317 A | 2/1997 | Knoth et al. |
| 5,714,956 A | 2/1998 | Jahne et al. |
| 5,719,641 A | 2/1998 | Mizoguchi |
| 5,808,575 A | 9/1998 | Himeno et al. |
| 5,810,477 A | 9/1998 | Abraham et al. |
| 6,088,461 A | 7/2000 | Lin |
| 6,201,490 B1 | 3/2001 | Kawano et al. |
| 6,271,780 B1 | 8/2001 | Gong et al. |
| 6,333,707 B1 | 12/2001 | Oberhammer et al. |
| 6,353,404 B1 | 3/2002 | Kuroiwa |
| 6,542,612 B1 | 4/2003 | Needham |
| 6,683,494 B2 | 1/2004 | Stanley |
| 6,745,355 B1 | 6/2004 | Tamura |
| 6,768,443 B2 | 7/2004 | Willis |
| 6,822,595 B1 | 11/2004 | Robinson |
| 6,853,242 B2 | 2/2005 | Melanson et al. |
| 6,888,888 B1 | 5/2005 | Tu et al. |
| 6,897,794 B2 | 5/2005 | Kuyel et al. |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,279,964 B2 | 10/2007 | Bolz et al. |
| 7,302,354 B2 | 11/2007 | Zhuge |
| 7,312,734 B2 | 12/2007 | McNeill et al. |
| 7,315,204 B2 | 1/2008 | Seven |
| 7,365,664 B2 | 4/2008 | Caduff et al. |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 7,671,768 B2 | 3/2010 | De Ceuninck |
| 7,679,538 B2 | 3/2010 | Tsang |
| 7,893,856 B2 | 2/2011 | Ek et al. |
| 8,060,663 B2 | 11/2011 | Murray et al. |
| 8,130,126 B2 | 3/2012 | Breitschaedel et al. |
| 8,289,425 B2 | 10/2012 | Kanbe |
| 8,330,631 B2 | 12/2012 | Kumar et al. |
| 8,362,936 B2 | 1/2013 | Ledzius et al. |
| 8,483,753 B2 | 7/2013 | Behzad et al. |
| 8,508,397 B2 | 8/2013 | Hisch |
| 8,717,211 B2 | 5/2014 | Miao et al. |
| 8,786,477 B1 | 7/2014 | Albinet |
| 8,836,551 B2 | 9/2014 | Nozaki |
| 8,873,182 B2 | 10/2014 | Liao et al. |
| 8,878,708 B1 | 11/2014 | Sanders et al. |
| 8,952,837 B2 | 2/2015 | Kim et al. |
| 9,071,267 B1 | 6/2015 | Schneider et al. |
| 9,071,268 B1 | 6/2015 | Schneider et al. |
| 9,118,401 B1 | 8/2015 | Nieto et al. |
| 9,148,164 B1 | 9/2015 | Schneider et al. |
| 9,171,552 B1* | 10/2015 | Yang .................. G10L 21/0316 |
| 9,210,506 B1 | 12/2015 | Nawfal et al. |
| 9,306,588 B2 | 4/2016 | Das et al. |
| 9,337,795 B2 | 5/2016 | Das et al. |
| 9,391,576 B1 | 7/2016 | Satoskar et al. |
| 9,525,940 B1 | 12/2016 | Schneider et al. |
| 9,543,975 B1 | 1/2017 | Melanson et al. |
| 9,596,537 B2 | 3/2017 | He et al. |
| 9,635,310 B2 | 4/2017 | Chang et al. |
| 2001/0009565 A1 | 7/2001 | Singvall |
| 2004/0078200 A1 | 4/2004 | Alves |
| 2004/0184621 A1 | 9/2004 | Andersen et al. |
| 2005/0258989 A1 | 11/2005 | Li et al. |
| 2005/0276359 A1 | 12/2005 | Xiong |
| 2006/0056491 A1 | 3/2006 | Lim et al. |
| 2006/0064037 A1* | 3/2006 | Shalon ................ A61B 5/0006 600/586 |
| 2006/0098827 A1 | 5/2006 | Paddock et al. |
| 2006/0284675 A1 | 12/2006 | Krochmal et al. |
| 2007/0026837 A1 | 2/2007 | Bagchi |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 | 5/2007 | Caduff et al. |
| 2007/0123184 A1 | 5/2007 | Nesimoglu et al. |
| 2008/0030577 A1 | 2/2008 | Cleary et al. |
| 2008/0114239 A1 | 5/2008 | Randall et al. |
| 2008/0143436 A1 | 6/2008 | Xu |
| 2008/0159444 A1 | 7/2008 | Terada |
| 2008/0198048 A1 | 8/2008 | Klein et al. |
| 2008/0292107 A1 | 11/2008 | Bizjak |
| 2009/0021643 A1 | 1/2009 | Hsueh et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0183163 A1 | 7/2010 | Matsui et al. |
| 2011/0013733 A1 | 1/2011 | Martens et al. |
| 2011/0025540 A1 | 2/2011 | Katsis |
| 2011/0029109 A1 | 2/2011 | Thomsen et al. |
| 2011/0063148 A1 | 3/2011 | Kolze et al. |
| 2011/0096370 A1 | 4/2011 | Okamoto |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0188671 A1 | 8/2011 | Anderson et al. |
| 2011/0228952 A1 | 9/2011 | Lin |
| 2011/0242614 A1 | 10/2011 | Okada |
| 2011/0268301 A1 | 11/2011 | Nielsen et al. |
| 2011/0285463 A1 | 11/2011 | Walker et al. |
| 2012/0001786 A1 | 1/2012 | Hisch |
| 2012/0047535 A1 | 2/2012 | Bennett et al. |
| 2012/0133411 A1 | 5/2012 | Miao et al. |
| 2012/0177201 A1 | 7/2012 | Ayling et al. |
| 2012/0177226 A1 | 7/2012 | Silverstein et al. |
| 2012/0188111 A1 | 7/2012 | Ledzius et al. |
| 2012/0207315 A1 | 8/2012 | Kimura et al. |
| 2012/0242521 A1 | 9/2012 | Kinyua |
| 2012/0250893 A1 | 10/2012 | Carroll et al. |
| 2012/0263090 A1 | 10/2012 | Porat et al. |
| 2012/0280726 A1 | 11/2012 | Colombo et al. |
| 2013/0095870 A1 | 4/2013 | Phillips et al. |
| 2013/0106635 A1 | 5/2013 | Doi |
| 2013/0129117 A1 | 5/2013 | Thomsen et al. |
| 2013/0188808 A1 | 7/2013 | Pereira et al. |
| 2013/0241753 A1 | 9/2013 | Nozaki |
| 2013/0241755 A1 | 9/2013 | Chen et al. |
| 2014/0044280 A1 | 2/2014 | Jiang |
| 2014/0105256 A1 | 4/2014 | Hanevich et al. |
| 2014/0105273 A1 | 4/2014 | Chen et al. |
| 2014/0135077 A1 | 5/2014 | Leviant et al. |
| 2014/0184332 A1 | 7/2014 | Shi et al. |
| 2014/0269118 A1 | 9/2014 | Taylor et al. |
| 2014/0368364 A1 | 12/2014 | Hsu |
| 2015/0009079 A1 | 1/2015 | Bojer |
| 2015/0170663 A1 | 6/2015 | Disch et al. |
| 2015/0214974 A1 | 7/2015 | Currivan |
| 2015/0214975 A1 | 7/2015 | Gomez et al. |
| 2015/0249466 A1 | 9/2015 | Elyada |
| 2015/0295584 A1 | 10/2015 | Das et al. |
| 2015/0381130 A1 | 12/2015 | Das et al. |
| 2016/0072465 A1 | 3/2016 | Das et al. |
| 2016/0080862 A1 | 3/2016 | He et al. |
| 2016/0080865 A1 | 3/2016 | He et al. |
| 2016/0173112 A1 | 6/2016 | Das et al. |
| 2016/0286310 A1 | 9/2016 | Das et al. |
| 2016/0365081 A1* | 12/2016 | Satoskar .............. G10K 11/175 |
| 2017/0047895 A1 | 2/2017 | Zanbaghi |
| 2017/0150257 A1 | 5/2017 | Das et al. |

FOREIGN PATENT DOCUMENTS

| | | |
|---|---|---|
| EP | 1753130 A1 | 2/2007 |
| EP | 1798852 A | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |

(56) References Cited

FOREIGN PATENT DOCUMENTS

| GB | 2527677 | B | 10/2016 |
|---|---|---|---|
| GB | 2539517 | A | 12/2016 |
| JP | 2008294803 | A | 12/2008 |
| WO | WO0054403 | A1 | 9/2000 |
| WO | 02/37686 | A2 | 5/2002 |
| WO | 200867260 | A1 | 6/2008 |
| WO | 2014113471 | A1 | 7/2014 |
| WO | 2015160655 | A1 | 10/2015 |
| WO | 2016040165 | A1 | 3/2016 |
| WO | 2016040171 | A1 | 3/2016 |
| WO | 2016040177 | A1 | 3/2016 |
| WO | 2016160336 | A1 | 10/2016 |
| WO | 2016202636 | A1 | 12/2016 |

OTHER PUBLICATIONS

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.
GB Patent Application No. 1419651.3, Improved Analogue-to-Digital Convertor, filed Nov. 4, 2014, 65 pages.
Combined Search and Examination Report, GB Application No. GB1506258.1, dated Oct. 21, 2015, 6 pages.
International Search Report and Written Opinion, International Patent Application No. PCT/US2015/025329, dated Aug. 11, 2015, 9 pages.
International Search Report and Written Opinion, International Patent Application No. PCT/US2015/048633, dated Dec. 10, 2015, 11 pages.
International Search Report and Written Opinion, International Patent Application No. PCT/US2015/048591, dated Dec. 10, 2015, 11 pages.
Combined Search and Examination Report, GB Application No. GB1510578.6, Aug. 3, 2015, 3 pages.
International Search Report and Written Opinion, International Application No. PCT/US2015/056357, dated Jan. 29, 2015, 13 pages.
Combined Search and Examination Report, GB Application No. GB1514512.1, dated Feb. 11, 2016, 7 pages.
International Search Report and Written Opinion, International Application No. PCT/US2015/048609, dated Mar. 23, 2016, 23 pages.
International Search Report and Written Opinion, International Application No. PCT/US2016/022578, mailed Jun. 22, 2016, 12 pages.
Combined Search and Examination Report, GB Application No. GB1600528.2, dated Jul. 7, 2016, 8 pages.
Combined Search and Examination Report, GB Application No. GB1603628.7, dated Aug. 24, 2016, 6 pages.
International Search Report and Written Opinion, International Application No. PCT/EP2016/062862, dated Aug. 26, 2016, 14 pages.
Combined Search and Examination Report, GB Application No. GB1602288.1, dated Aug. 9, 2016, 6 pages.
International Search Report and Written Opinion of the International Searching Authority, International Application No. PCT/US2016/065134, dated Mar. 15, 2017.
International Search Report and Written Opinion of the International Searching Authority, International Application No. PCT/US2017/014240, dated Apr. 24, 2017.
International Search Report and Written Opinion of the International Searching Authority, International Application No. PCT/US2016/040096, dated Mar. 24, 2017.
Groeneweg, B.P., et al., A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.
Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.
Combined Search and Examination Report under Sections 17 and 18(3) of the UKIPO, Application No. GB1620428.1, dated Jul. 21, 2017.
Combined Search and Examination Report under Sections 17 and 18(3), United Kingdom Intellectual Property Office, Application No. GB1700371.6, dated Aug. 1, 2017.

\* cited by examiner

ENHANCING DYNAMIC RANGE BASED ON SPECTRAL CONTENT OF SIGNAL

FIELD OF DISCLOSURE

The present disclosure relates in general to circuits for audio devices, including without limitation personal audio devices, such as wireless telephones and media players, and more specifically, to systems and methods for reducing audio artifacts in a system for enhancing a dynamic range of an audio signal path in an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

One particular characteristic of a personal audio device, which may affect its marketability and desirability, is the dynamic range of its audio output signal. Stated simply, the dynamic range is the ratio between the largest and smallest values of the audio output signal. One way to increase dynamic range is to apply a high gain to the power amplifier. However, noise present in an audio output signal may be a generally monotonically increasing function of the gain of the power amplifier, such that any increased dynamic range as a result of a high-gain amplifier may be offset by signal noise which may effectively mask lower-intensity audio signals.

U.S. patent application Ser. No. 14/083,972, filed Nov. 19, 2013, entitled "Enhancement of Dynamic Range of Audio Signal Path," and assigned to the applicant (Cirrus Logic, Inc.) of the present disclosure (the "'972 Application") discloses methods and systems for enhancing the dynamic range of an audio signal path. In the '972 Application, an apparatus for providing an output signal to an audio transducer includes an analog signal path portion, a digital-to-analog converter (DAC), and a control circuit. The analog signal path portion has an audio input for receiving an analog signal, an audio output for providing the output signal, and a selectable analog gain, and may be configured to generate the output signal based on the analog signal and in conformity with the selectable analog gain. The DAC has a selectable digital gain and may be configured to convert a digital audio input signal into the analog signal in conformity with the selectable digital gain. The control circuit may be configured to select the selectable analog gain and select the selectable digital gain based on a magnitude of a signal indicative of the output signal.

In the '972 Application, when changing selection between the selectable digital gain and the selectable analog gain, audible audio artifacts (e.g., "pops" and "clicks") may be heard by a listener of an audio device unless measures are taken to reduce or eliminate such audio artifacts.

U.S. Pat. No. 8,194,889, granted Jun. 5, 2012, entitled Hybrid Digital/Analog Loudness-Compensating Volume Control (the "'889 Patent"), discloses a loudness-compensating volume control method that imposes a desired loudness scaling on an audio signal by processing the audio signal in both the digital and analog domains by receiving a desired loudness scaling, deriving a wideband gain component and one or more other gain components from the desired loudness scaling, applying in the digital domain modifications to the audio signal based on the one or more other gain components to produce a partly-modified audio signal, and applying in the analog domain modifications to the partly-modified audio signal based on the wideband gain component. In the '889 Patent, when modifying and applying the wideband gain component, audible audio artifacts may be heard by a listener of an audio device unless measures are taken to reduce or eliminate such audio artifacts.

SUMMARY

In accordance with the teachings of the present disclosure, one or more disadvantages and problems associated with existing approaches to reducing audio artifacts in a system for maintaining a high dynamic range of an audio signal path may be reduced or eliminated.

In accordance with embodiments of the present disclosure, an apparatus for providing an output signal to an audio transducer may include a signal path and a control circuit. The signal path may include an analog signal path portion having an audio input for receiving an analog signal, an audio output for providing an output signal, and a selectable analog gain, and configured to generate the output signal based on the analog signal and in conformity with the selectable analog gain and a digital path portion having a selectable digital gain and configured to receive a digital input signal and convert the digital input signal into the analog signal in conformity with the selectable digital gain. The control circuit may be configured to determine a spectral content of a signal indicative of the output signal and change the selectable digital gain and the selectable analog gain based on the spectral content.

In accordance with these and other embodiments of the present disclosure, a method may include, in a signal path comprising an analog signal path portion having an audio input for receiving an analog signal, an audio output for providing an output signal, and a selectable analog gain, and configured to generate the output signal based on the analog signal and in conformity with the selectable analog gain and further comprising a digital path portion having a selectable digital gain and configured to receive a digital input signal and convert the digital input signal into the analog signal in conformity with the selectable digital gain, determining a spectral content of a signal indicative of the output signal. The method may also include changing the selectable digital gain and the selectable analog gain based on the spectral content.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may include a signal path having a digital path portion (e.g., an audio compressor) and an analog path portion (e.g., an audio expander). The digital path portion may be configured to receive a digital input signal (e.g., a digital audio signal), apply a selectable digital gain x to the digital input signal, and convert the digital input signal (e.g., via a digital-to-analog converter) to an analog signal in conformity with the selectable digital gain. The analog path portion may be configured to receive the analog signal and apply (e.g., by an analog amplifier) a selectable analog gain k/x to the analog signal to generate an output signal, wherein said output signal may be communicated to a loudspeaker for playback and/or to other circuitry for processing. The numerator k of the selectable analog gain may be a constant defining an overall cumulative gain of the signal path. A control circuit coupled to the signal path may be capable of modifying the selectable digital gain and the selectable analog gain, for example to maximize a dynamic range of the signal path. For example, based on analysis of the output signal or another signal within the signal path indicative of the output signal, the control circuit may select a value for the selectable digital gain and a corresponding value for the selectable analog gain. Thus, for lower magnitudes of the output signal, the control circuit may select a higher selectable digital gain and a lower selectable analog gain, and for higher magnitudes of the output signal, the control circuit may select a lower selectable digital gain and a higher selectable analog gain. Such selectable gains may allow a signal path to increase its dynamic range to lower-magnitude signals, while preventing undesirable effects such as signal clipping for higher-magnitude signals. In operation, the control circuit may also be configured to predict, based on a magnitude of a signal indicative of the output signal, a condition for changing the selectable digital gain and the selectable analog gain, and responsive to predicting the occurrence of the condition, change, at an approximate time in which a zero crossing of the signal indicative of the output signal occurs, the selectable digital gain and the selectable analog gain.

Figure 1:
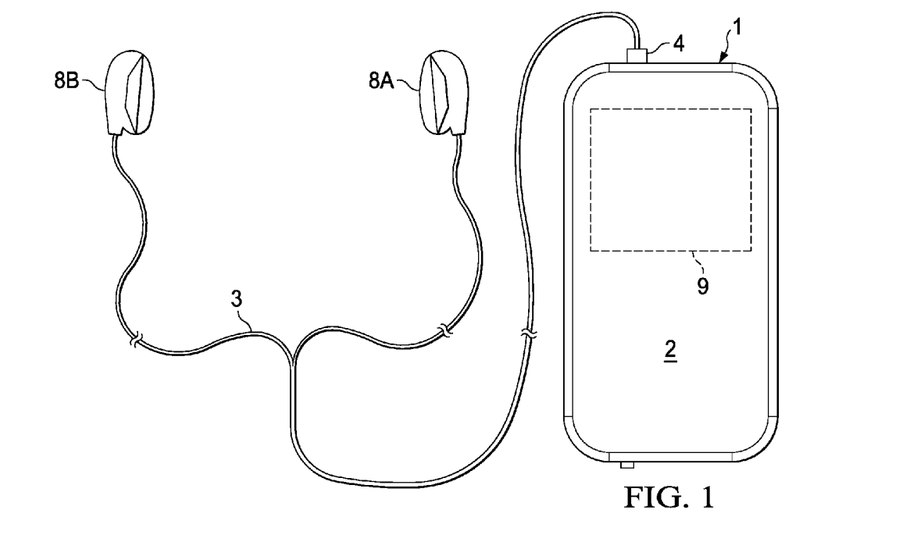
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
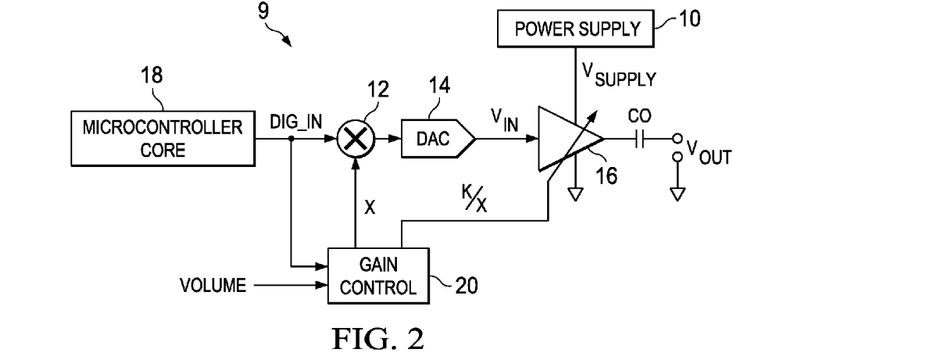
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital gain element 12 to apply a selectable digital gain x selected by gain control 20 to the digital input signal DIG_IN. The amplified digital audio input signal may be communicated to a digital-to-analog converter (DAC) 14, which may convert the digital audio input signal to an analog signal $Y_{IN}$. Together, digital gain element 12 and DAC 14 may be referred to herein as a digital path portion of the signal path from the input node for digital audio input signal DIG_IN to the output node for output voltage signal $V_{OUT}$ depicted in FIG. 2. In the relevant art, digital gain element 12 and DAC 14 may sometimes be referred to as an audio compressor.

DAC 14 may supply analog signal $Y_{IN}$ to an amplifier stage 16 which may amplify or attenuate audio input signal $Y_{IN}$ in conformity with a selectable analog gain k/x to provide an audio output signal $V_{OUT}$, which may operate a speaker, headphone transducer, a line level signal output, and/or other suitable output. Amplifier stage 16 may be referred to herein as an analog path portion of the signal path from the input node for digital audio input signal DIG_IN to the output node for output voltage signal $V_{OUT}$ depicted in FIG. 2. In the relevant art, amplifier stage 16 may sometimes be referred to as an audio expander. A capacitor CO may be utilized to couple the output signal to the transducer or line level output, particularly if amplifier stage 16 is operated from a unipolar power supply having a quiescent voltage substantially differing from ground. A power supply 10 may provide the power supply rail inputs of amplifier stage 16.

As shown in FIG. 2, audio IC 9 may include a gain control circuit 20 configured to, based on digital audio input signal DIG_IN, control selectable digital gain x of gain element 12 and a selectable analog gain k/x of amplifier stage 16. In embodiments in which a volume control is present, a volume control signal may be provided from a microcontroller or other digital control circuit responsive to a user interface, volume knob encoder or program command, or other suitable mechanism.

As an example of the dynamic range enhancement functionality of audio IC 9, when digital audio input signal DIG_IN is at or near zero decibels (0 dB) relative to the full-scale voltage of the digital audio input signal, gain control circuit 20 may select a first digital gain (e.g., $x_1$) for the selectable digital gain and a first analog gain (e.g., $k/x_1$) for the selectable analog gain. However, if the magnitude of digital audio input signal DIG_IN is below a particular predetermined threshold magnitude relative to the full-scale voltage of digital audio input signal DIG_IN (e.g., −20 dB), gain control circuit 20 may select a second digital gain (e.g., $x_2$) greater than the first digital gain (e.g., $x_2 > x_1$) for the selectable digital gain and a second analog gain (e.g., $k/x_2$) lesser than the first analog gain (e.g., $k/x_2 < k/x_i$) for the selectable analog gain. In each case, the cumulative path gain (e.g., k) of the selectable digital gain and the selectable analog gain may be substantially constant (e.g., the same within manufacturing and/or operating tolerances of audio IC 9). In some embodiments, k may be approximately equal to 1, such that the cumulative path gain is a unity gain. Such modification of digital gain and analog gain may increase the dynamic range of audio IC 9 compared to approaches in which the digital gain and analog gain are static, as it may reduce the noise injected into audio output signal $V_{OUT}$, which noise may be a generally monotonically increasing function of the analog gain of amplifier stage 16. While such noise may be negligible for higher magnitude audio signals (e.g., at or near 0 dB relative to full-scale voltage), the presence of such noise may become noticeable for lower magnitude audio signals (e.g., at or near −20 dB or lower relative to full-scale voltage). By applying a smaller analog gain at amplifier stage 16 for smaller signal magnitudes, the amount of noise injected into audio output signal $V_{OUT}$ may be reduced, while the signal level of audio output signal $V_{OUT}$ may be maintained in accordance with the digital audio input signal DIG_IN through application of a digital gain to gain element 12 inversely proportional to the analog gain.

Figure 3:
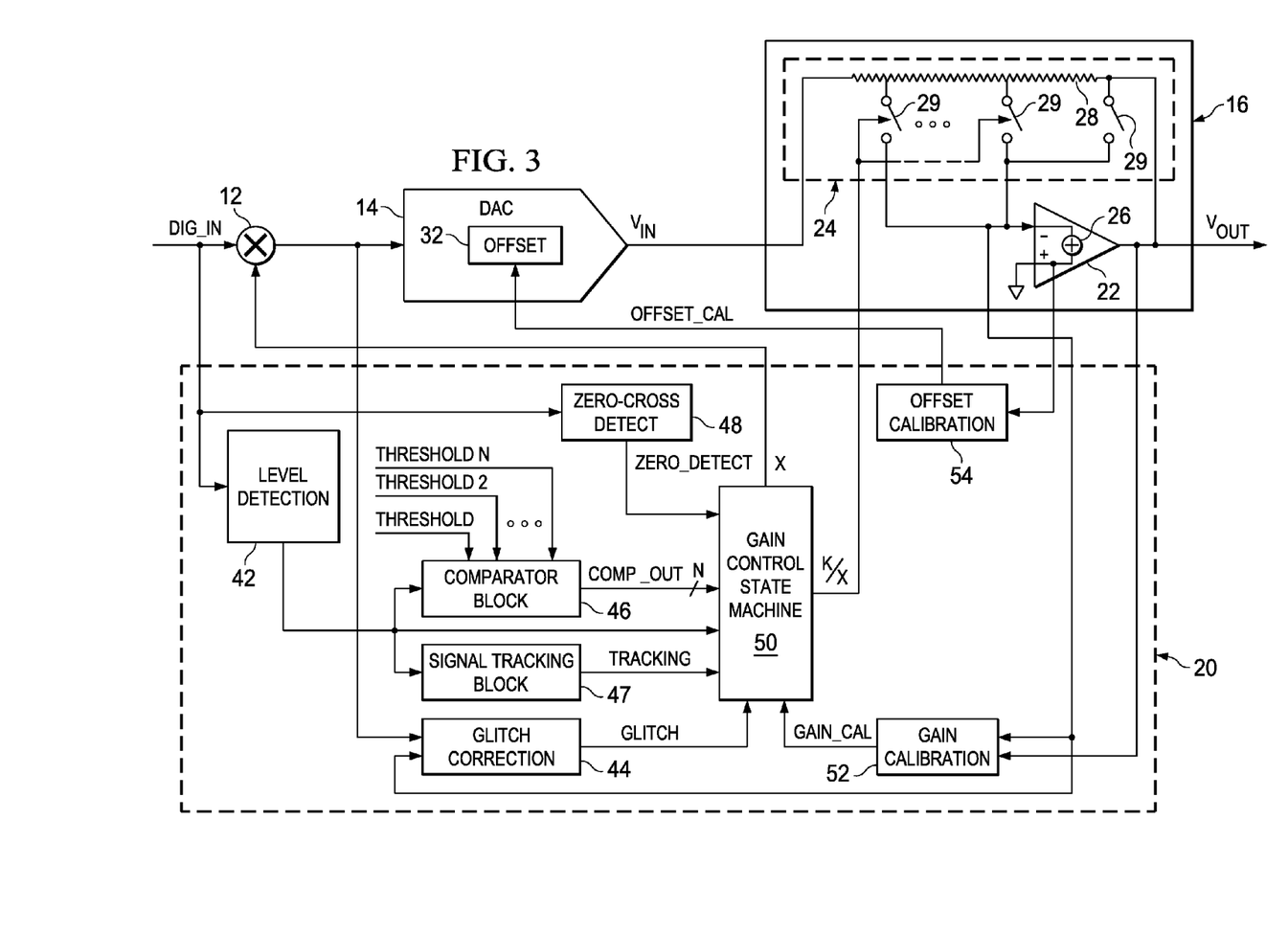
FIG. 3 is a block diagram of selected components of a gain control circuit for use within the audio integrated circuit depicted in FIG. 2, and selected components of an audio integrated circuit which may be coupled to the gain control circuit, in accordance with embodiments of the present disclosure.

FIG. 3 is a block diagram of selected components of an example gain control circuit 20 for use within audio IC 9, and selected components of audio IC 9 which may be coupled to gain control circuit 20, in accordance with embodiments of the present disclosure. As shown in FIG. 3, gain control circuit 20 may include a level detection circuit 42, a comparator block 46, a signal tracking block 47, a zero-cross detection circuit 48, a glitch correction circuit 44, a gain calibration circuit 52, an offset calibration circuit 54, and a gain control state machine 50. Level detection circuit 42 may include any suitable system, device, or apparatus for receiving digital audio input signal DIG_IN (or a derivative thereof), determining a magnitude of such signal, and outputting a signal indicative of such magnitude. Comparator block 46 may compare the output signal of level detection circuit 42 with N predetermined threshold magnitudes, wherein N is a positive integer, and based on such comparison, output a signal COMP_OUT (which may comprise N bits) indicative of whether the desired magnitude of audio output signal $V_{OUT}$ is greater or lesser than each of such predetermined threshold magnitudes. In some embodiments, such predetermined threshold magnitudes may be relative to a full-scale voltage of digital audio input signal DIG_IN and/or audio output signal $V_{OUT}$. In some embodiments, comparator block 46 may implement hysteresis, such that signal COMP_OUT or a bit thereof may only transition if the output signal of level detection block 42 remains above or below a predetermined threshold magnitude for a minimum duration of time (e.g., 0.1 seconds to place any switching artifacts outside the human-perceptible audio range).

Zero-cross detection circuit 48 may include any suitable system, device, or apparatus for detecting the occurrence of a zero crossing of a digital audio input signal (or a derivative thereof) and outputting a signal ZERO_DETECT indicating that a zero crossing of such signal has occurred. A zero crossing of a signal may occur when the waveform of such signal crosses a magnitude of zero or crosses another level within a threshold of zero and indicative of a zero crossing (e.g., a low signal level of lower than −70 dB or within a small number of least significant bits of zero).

Signal tracking block 47 may comprise any suitable system, device, or apparatus for tracking a particular parameter of an audio signal, including without limitation a plurality of peaks of such audio signal and/or a signal envelope of such audio signal, and based thereon, generate an output signal TRACKING indicative of such tracked parameter.

Glitch correction circuit 44 may comprise any suitable system, device, or apparatus for correcting for a latency or group delay between the output of gain element 12 and the input of amplifier stage 16. Such glitch correction may account for a change of the selectable digital gain of gain element 12 which requires a latency to propagate to amplifier stage 16 where a corresponding selectable analog gain may be applied. Without such correction, the latency of group delay may cause audio artifacts to appear at the output of the signal path.

Gain calibration circuit 52 may comprise any suitable system, device, or apparatus for correcting for a non-ideal gain of amplifier stage 16. To illustrate, amplifier stage 16 may comprise an operational amplifier 22 and a switched resistor network 24 comprising a resistor string 28 having a plurality of taps each coupled to a corresponding switch 29. To apply a desired selectable analog gain to amplifier stage 16, switches 29 may be selectively opened and closed to create an effective resistance between a negative input of operational amplifier 22 and the output of operational amplifier 22, wherein the selectable analog gain of operational amplifier 22 is based on such effective resistance. However, due to non-idealities of amplifier stage 16 (e.g., temperature variations, process tolerances, etc.), an actual gain of amplifier stage 16 may differ from that of a desired level of gain determined by gain control state machine 50. Accordingly, gain calibration circuit 52 may determine the actual gain of amplifier stage 16 and output a signal GAIN_CAL indicative of such actual gain, and gain control state machine 50 may correct for non-idealities in selecting the selectable digital gain.

Offset calibration circuit 54 may comprise any suitable system, device, or apparatus for correcting for an offset of amplifier stage 16. To illustrate, operational amplifier 22 may include, due to non-idealities of amplifier stage 16 (e.g., temperature variations, process tolerances, etc.), a slight offset 26 from a desired ground or common mode voltage associated with amplifier stage 16, which may affect signal output $V_{OUT}$. Accordingly, offset calibration circuit 54 may determine the offset 26 of amplifier stage 16 and output a signal OFFSET_CAL, which may be communicated to an offset block 32 of DAC 14 such that DAC 14 may correct for such analog offset.

Gain control state machine 50 may receive signals COMP_OUT, TRACKING, ZERO_DETECT, GLITCH, and/or GAIN_CAL and based on one or more of such signals, generate the selectable digital gain and the selectable analog gain, as described in greater detail elsewhere in this disclosure. For example, when the magnitude of digital audio input signal DIG_IN transitions from above to below a predetermined threshold magnitude (e.g., −24 dB), signal COMP_OUT may indicate such transition and in response, gain control state machine 50 may wait until the occurrence of a zero crossing (as indicated by signal ZERO_DETECT), after which it may cause DAC 14 to increase the selectable digital gain and decrease the selectable audio gain a similar amount. By changing the selectable digital gain and the selectable audio gain at a zero crossing of digital audio input signal DIN_IN (or a derivative thereof), the change and any auditory artifacts associated with the change may be masked and therefore be unnoticeable or less noticeable to a listener of an audio device including audio IC 9.

As another example, when the sum of the magnitude of digital audio input signal DIG_IN transitions from below to above a predetermined threshold magnitude (e.g., −24 dB), signal COMP_OUT may indicate such transition, and in response gain control state machine 50 may cause DAC 14 to decrease the selectable digital gain and increase the selectable audio gain in a similar amount. However, when transitioning to lower digital gain mode, it may not be desirable to wait for a zero cross of the output signal, as a transition from below to above the predetermined threshold magnitude may almost immediately lead to clipping of the audio signal. Accordingly, it may be desirable to predict whether the magnitude of digital audio input signal DIG_IN is likely to cross such predetermined threshold and switch the selectable digital gain and the selectable analog gain responsive to such prediction at a zero crossing event of the digital audio input signal DIG_IN occurring before crossing of the predetermined threshold by the digital audio input signal DIG_IN. By applying such predictive techniques, examples of which are explained below and illustrated by FIGS. 4-7, gain control circuit 20 may facilitate switching between gain modes to increase dynamic range while reducing audio artifacts.

FIGS. 4 through 7 illustrate example waveforms demonstrating predictive methodologies that may be performed by gain control circuit 20. In each of FIGS. 4 through 7, the y-axis represents a voltage of digital audio input signal DIG_IN given in decibels relative to a full-scale voltage of digital audio input signal DIG_IN.

Figure 4:
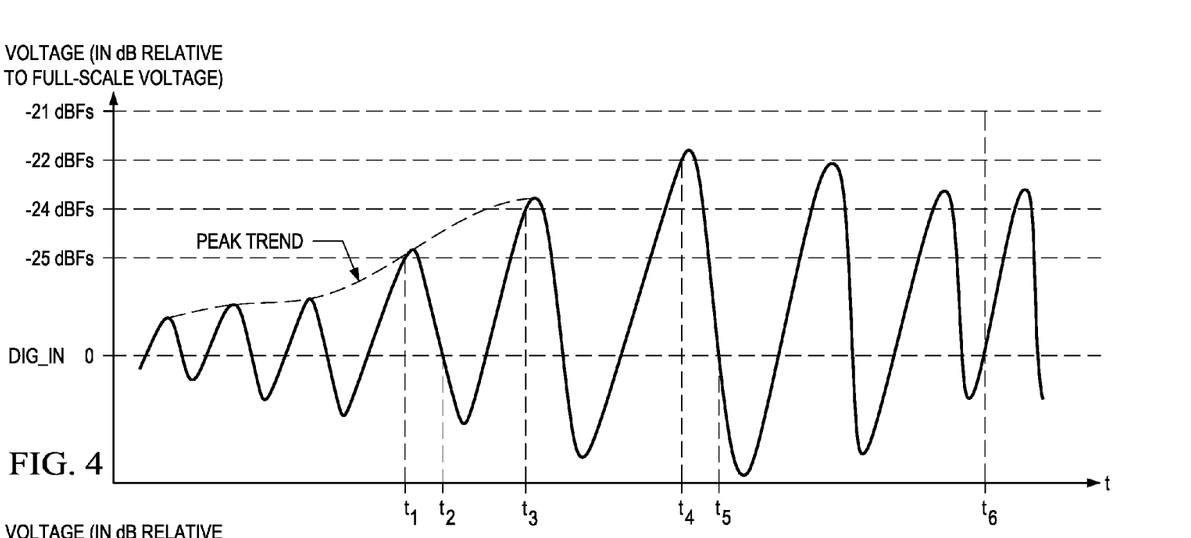
FIGS. 4 through 7 illustrate example waveforms demonstrating predictive methodologies performed by the gain control circuit depicted in FIG. 3. In accordance with embodiments of the present disclosure.

As depicted in the example waveform graph for digital audio input signal DIG_IN versus time shown in FIG. 4, gain control circuit 20 may predict whether the magnitude of digital audio input signal DIG_IN is likely to cross a predetermined primary threshold by determining whether digital audio input signal DIG_IN (or a derivative thereof) crosses a secondary threshold. To illustrate, to predict whether digital audio input signal DIG_IN will increase above a primary threshold for switching between gain modes of gain element 12 and amplifier stage 16 (e.g., −24 dB relative to full-scale voltage of digital audio input signal DIG_IN), gain control circuit 20 may monitor (e.g., with comparator block 46) whether digital audio input signal DIG_IN increases above a secondary threshold (e.g., −25 dB relative to full-scale voltage of digital audio input signal DIG_IN) lower than the primary threshold, which occurs at time $t_1$ shown in FIG. 4. Responsive to digital audio input signal DIG_IN increasing above such secondary threshold, gain control circuit 20 may wait for the next zero-crossing event of digital audio input signal DIG_IN (e.g., as detected by zero-cross detection circuit 48) which occurs at time $t_2$ shown in FIG. 4. At such zero-cross event, gain control circuit 20 may decrease the selectable digital gain and increase the selectable analog gain by the same amount. When digital audio input signal DIG_IN subsequently increases above the primary threshold (e.g., above −24 dB), which occurs at time $t_3$ shown in FIG. 4, no changes in selectable digital gain and selectable analog gain may occur, as such change already occurred at the previous zero-crossing event.

In some embodiments, gain control state machine 50 may also implement a timing element (e.g., a timer or counter) in connection with a secondary threshold to determine whether digital audio input signal DIG_IN will increase above a primary threshold. To illustrate, to predict whether digital audio input signal DIG_IN will increase above a primary threshold (e.g., −21 dB relative to full-scale voltage of digital audio input signal DIG_IN) for switching between gain modes of gain element 12 and amplifier stage 16, gain control circuit 20 may monitor (e.g., with comparator block 46) whether digital audio input signal DIG_IN increases above a secondary threshold (e.g., −22 dB relative to full-scale voltage of digital audio input signal DIG_IN) lower than the primary threshold, which occurs at time $t_4$ shown in FIG. 4. Responsive to digital audio input signal DIG_IN increasing above such secondary threshold, gain control circuit 20 may wait for the next zero-crossing event of digital audio input signal DIG_IN (e.g., as detected by zero-cross detection circuit 48) which occurs at time $t_5$ shown in FIG. 4. At such zero-cross event, gain control circuit 20 may decrease the selectable digital gain and increase the selectable analog gain by the same amount. In addition, responsive to digital audio input signal DIG_IN increasing above such secondary threshold at time $t_4$, gain control state machine 50 may initiate a timing element to time a duration beginning at the time $t_4$ in which the digital audio input signal DIG_IN increases above such secondary threshold. If, prior to the duration of time expiring, digital audio input signal DIG_IN increases above the primary threshold, gain control circuit 20 may maintain the selectable digital gain and increase the selectable analog gain at the levels to which they were switched at the zero-crossing event at time $t_5$. Otherwise, if the duration of time expires, shown as time $t_6$ in FIG. 4, prior to digital audio input signal DIG_IN increasing above the primary threshold, gain control circuit 20 may predict that an increase above the primary threshold may not occur, and may switch the selectable digital gain and increase the selectable analog gain at the levels which they had prior to the zero-crossing event at time $t_5$.

In these and other embodiments, gain control circuit 20 may employ signal tracking techniques to predict whether digital audio input signal DIG_IN may increase above a secondary threshold. For example, gain control circuit 20 (e.g., via signal tracking block 47) may track a peak trend of the magnitude peaks of digital audio input signal DIG_IN as shown in FIG. 4. From tracking the magnitude peaks, gain control circuit 20 may extrapolate the trend to determine if the magnitude of digital audio input signal DIG_IN is trending towards increasing above a primary threshold (e.g., −24 dB relative to full-scale voltage of digital audio input signal DIG_IN). Additionally or alternatively tracking peak trends, gain control circuit 20 (e.g., via signal tracking block 47) may similarly track a signal envelope of digital audio input signal DIG_IN to determine whether digital audio input signal DIG_IN is trending towards increasing above a primary threshold.

Although FIG. 4 and the foregoing description thereof has depicted use of predictive approaches for determining whether digital audio output signal DIG_IN is likely to increase from below to above a primary threshold, similar approaches (e.g., secondary thresholds, timing elements, peak tracking, signal envelope tracking, etc.) may also be used to determine whether digital audio output signal DIG_IN is likely to decrease from above to below a primary threshold and switch between gain modes of the selectable digital gain and the selectable analog gain in response to such predictions.

Figure 5:
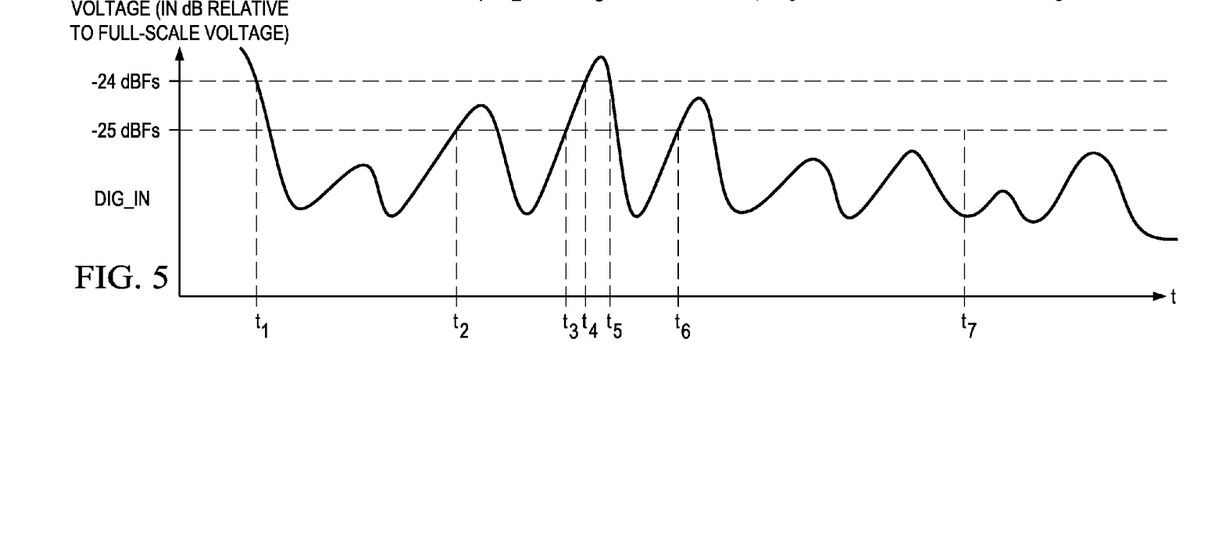

In addition or alternatively to the embodiments discussed above, gain control circuit 20 may employ a secondary threshold and a timing element to predict whether magnitude of digital audio input signal DIG_IN is to decrease below a predetermined primary threshold and remain below such primary threshold, as illustrated in FIG. 5.

In the embodiments represented by FIG. 5, gain control state machine 50 may initiate a timing element for a predetermined duration whenever the magnitude of digital audio input signal DIG_IN decreases from above to below a primary threshold (e.g., −24 dB relative to full-scale voltage of digital audio input signal DIG_IN) shown as times $t_1$ and $t_4$ in FIG. 5. If prior to the duration of time expiring, digital audio input signal DIG_IN increases above a secondary threshold (e.g., −25 dB relative to full-scale voltage of digital audio input signal DIG_IN) lesser than the primary threshold shown as times $t_2$, $t_3$, and $t_6$ in FIG. 5, the timing element may reset the predetermined duration of time. Upon expiration of the duration of time, shown as occurring at time $t_7$ in FIG. 5, thus indicating that digital audio input signal DIG_IN has not increased above the secondary threshold for longer than the duration of time, and provided that digital audio input signal DIG_IN is below the primary threshold, gain control circuit 20 may thus predict that digital audio input signal DIG_IN is and will remain below the primary threshold, and accordingly increase the selectable digital gain and decrease the selectable analog gain by the same amount. By using this predictive methodology, gain control circuit 20 may avoid switching events if the magnitude of digital audio input signal DIG_IN falls below the primary threshold but then in a short amount of time rises above the primary threshold again for a brief period of time. For example, in the graph depicted in FIG. 5, this predictive methodology prevents gain switching events from occurring at times $t_4$ and $t_5$.

Figure 6:
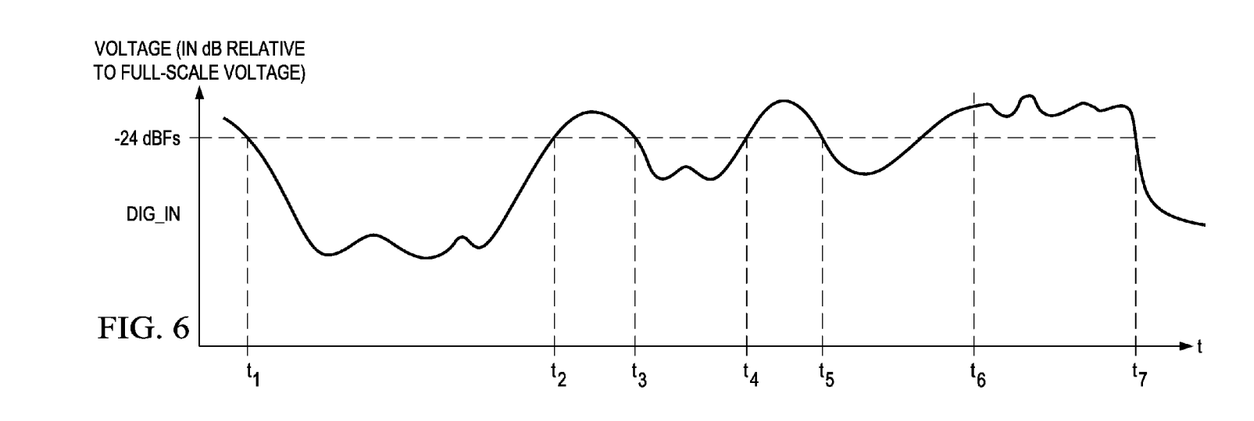

In addition or alternatively to the embodiments discussed above, gain control circuit 20 may employ one or more timing elements to disable switching between gain modes when the magnitude of digital audio input signal DIG_IN hovers near a primary threshold, as illustrated in FIG. 6. In the embodiments represented by FIG. 6, upon the magnitude of digital audio input signal DIG_IN crossing a primary threshold (e.g., −24 dB relative to full-scale voltage of digital audio input signal DIG_IN), shown as times $t_1$, $t_2$, $t_3$, $t_4$, $t_5$, $t_6$, and $t_7$ in FIG. 6, gain control state machine 50 may initiate a timing element for a predetermined duration. If prior to the predetermined duration of time expiring, digital audio input signal DIG_IN again crosses the primary threshold (e.g., the difference between times $t_2$ and each of times $t_3$, $t_4$, and/or $t_5$ may be less than the predetermined duration of time), gain control circuit 20 may disable switching between gain modes (e.g., switching would not occur at times $t_3$, $t_4$, and $t_5$). Upon expiration of the predetermined duration of time, shown as occurring at time $t_6$ in FIG. 6 (e.g., the difference between time $t_5$ and time $t_6$ may be more than the predetermined duration of time), thus indicating that digital audio input signal DIG_IN has not crossed the primary threshold for longer than the predetermined duration of time, gain control circuit 20 may thus predict that digital audio input signal DIG_IN has not crossed the primary threshold for a period of time and may re-enable switching between gain modes when digital audio input signal DIG_IN again crosses the primary threshold, shown as time $t_7$ in FIG. 6. By using this predictive methodology, gain control circuit 20 may avoid multiple switching events if the magnitude of digital audio input signal DIG_IN hovers near the primary threshold.

Figure 7:
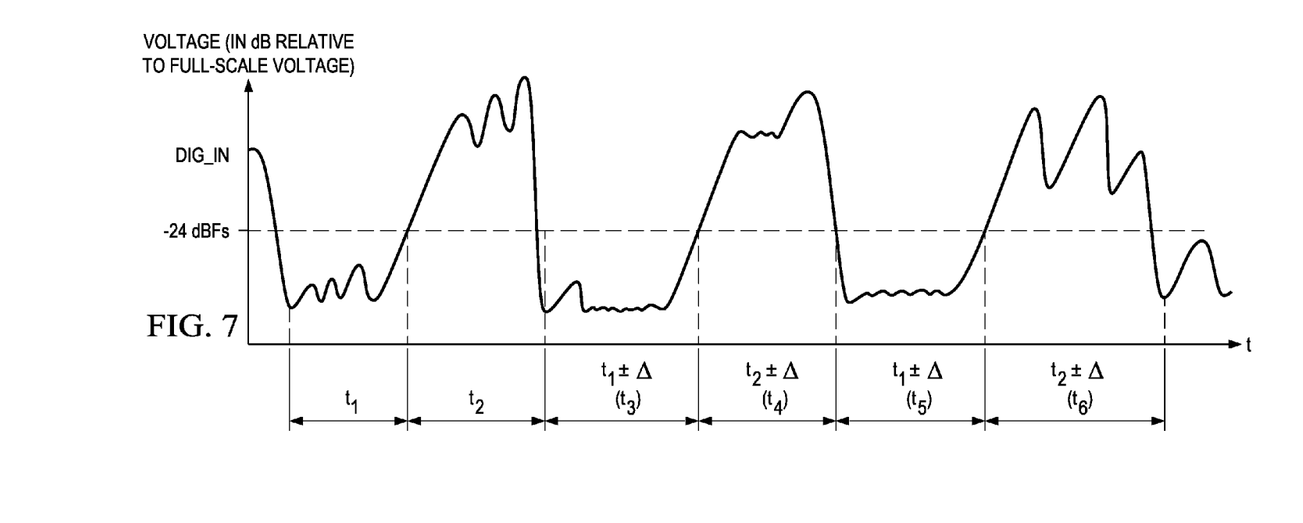

In addition or alternatively to the embodiments discussed above, gain control circuit 20 may be configured to predict when digital audio input signal DIG_IN has a persistent pattern of magnitude relative to a primary threshold, as illustrated in FIG. 7. To predict a persistent pattern, gain control state machine 50 may record a period of time $t_1$ in which digital audio input signal DIG_IN remains below a primary threshold (e.g., −24 dB relative to full-scale voltage of digital audio input signal DIG_IN) and record a period of time $t_2$ in which digital audio input signal DIG_IN remains above the primary threshold. For one or more subsequent periods (e.g., time periods $t_3$, $t_5$) in which digital audio input signal DIG_IN is below the primary threshold, gain control state machine 50 may determine a duration of such periods and compare them to the duration of the recorded period of time $t_1$. If the one or more subsequent periods are within a certain duration of time $\Delta$ of the recorded period of time $t_1$ (e.g., $t_1 - \Delta \leq t_3 \leq t_1 + \Delta$), gain control circuit 20 may determine that digital audio input signal DIG_IN has a persistent pattern. Similarly, for one or more subsequent periods (e.g., time periods $t_4$, $t_6$) in which digital audio input signal DIG_IN is above the primary threshold, gain control state machine 50 may determine a duration of such periods and compare them to the duration of the recorded period of time $t_2$. If the one or more subsequent periods are within a certain duration of time $\Delta$ of the recorded period of time $t_1$ (e.g., $t_2 - \Delta \leq t_4 \leq t_2 + \Delta$), gain control circuit 20 may determine that digital audio input signal DIG_IN has a persistent pattern. In some embodiments, responsive to determining that a persistent pattern exists, gain control circuit 20 may disable switching between gain modes of the selectable digital gain and the selectable audio gain. In other embodiments, when a persistent pattern exists, gain control circuit 20 may use information regarding the persistent pattern (e.g., time periods $t_1$ and/or $t_2$) to predict occurrence of a future crossing of the primary threshold by digital audio input signal DIG_IN, and cause a switch between gain modes at a zero-crossing event occurring immediately before the future crossing of the primary threshold.

In addition or alternatively to the embodiments discussed above, gain control circuit 20 may be configured to predict when digital audio input signal DIG_IN crosses a primary threshold by receiving digital audio input signal DIG_IN and processing such signal before the signal propagates to gain element 12 and amplifier stage 16, such that gain control circuit 20 may determine and apply the desired selectable digital gain and selectable audio gain at or before the signal propagates to such gain elements.

In these and other embodiments, gain control circuit 20 may reduce audio artifacts associated with switching between a non-unity gain mode and a unity gain mode by implementing three or more intermediate dynamic range modes. For instance, in some embodiments, gain control circuit 20 may implement eight intermediate dynamic range modes wherein the selectable digital gains of the various gain modes are −24 dB, −21 dB, −18 dB, −15 dB, −12 dB, −9 dB, −6 dB, −3 dB and 0 dB and the corresponding selectable analog gains are 24 dB, 21 dB, 18 dB, 15 dB, 12 dB, 9 dB, 6 dB, 3 dB and 0 dB. In addition, gain control circuit 20 may be configured to transition between the respective gain modes and a plurality of respective predetermined threshold magnitude levels. For example, gain control circuit 20 may transition between the −24 dB gain mode and the −21 dB gain mode in response to the magnitude of the output signal crossing −24 dB, may transition between the −21 dB mode and the −18 dB mode in response to the magnitude of the output signal crossing −21 dB, may transition between the −18 dB mode and the −15 dB mode in response to the magnitude of the output signal crossing −18 dB, and so on. In these embodiments, gain control circuit 20 may also be configured to, using some or all of the methods previously described, predict a crossing of a particular threshold level, and based on such predicting, switch between the various modes at approximate occurrence of a zero crossing of the output signal, so as to reduce audio artifacts.

Using the methods and systems herein disclosed, changes in a gain mode of a signal path and audio artifacts associated therewith may be masked by predicting a gain mode threshold-crossing and in response to such prediction, pre-emptively switching ahead of such threshold-crossing at a zero-crossing of an audio signal. In the case of quickly-rising signals that cross a threshold for switching between gain modes, such prediction and preemptive switching at a zero-crossing may not be necessary to avoid audio artifacts, as a quickly-rising transient nature of a signal may mask audio artifacts. However, in the case of a slower-rising signal that crosses a gain mode threshold-crossing, the transient effects may not mask audio artifacts, and thus the methods and systems disclosed herein for predicting a gain mode threshold-crossing and in response to such prediction may be employed to mask such artifacts.

Figure 8:
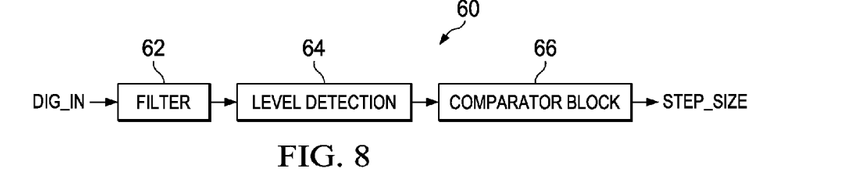
FIG. 8 is a block diagram of selected components of an example control subcircuit that may be used within a gain control state machine, in accordance with embodiments of the present disclosure.

In addition to the foregoing functionality, gain control state machine 50 may also be configured to determine a spectral content of a signal indicative of output voltage signal $V_{OUT}$ (e.g., digital audio input signal DIG_IN) and may control changes to the selectable digital gain and the selectable analog gain based on the spectral content. To illustrate, FIG. 8 depicts an example control subcircuit 60 that may be used within gain control state machine 50 for setting step size for changes to the selectable digital gain and the selectable analog gain based on the spectral content, in accordance with embodiments of the present disclosure. As shown in FIG. 8, control subcircuit 60 may comprise a filter 62, a level detection circuit 64, and a comparator block 66. Filter 62 may comprise any suitable system, device, or apparatus for receiving digital audio input signal DIG_IN (or a derivative thereof), and outputting a filtered signal in accordance with a filter response of filter 62. In some embodiments, filter 62 may comprise one of a low-pass filter, a bandpass filter, and a high-pass filter. In these and other embodiments, filter 62 may comprise a filter designed to mimic an auditory responsiveness of a human ear.

Level detection circuit 64 may include any suitable system, device, or apparatus for receiving the filtered signal generated by filter 62, determining a magnitude of such signal, and outputting a signal indicative of such magnitude. Comparator block 66 may compare the output signal of level detection circuit 62 with a predetermined threshold magnitude, and based on such comparison, output a signal STEP_SIZE indicative of whether the filtered signal is greater or lesser than such predetermined threshold magnitude. The signal STEP_SIZE may indicate a step size to be used when changing the selectable digital gain and the selectable analog gain. For example, if the filtered signal generated by filter 62 is above the predetermined threshold magnitude, a larger step size (e.g., 12 dB) may be employed, such that when gain control state machine 50 changes the selectable digital gain and the selectable analog gain, it does so in steps equal to the larger step size indicated by the signal STEP_SIZE. On the other hand, if the filtered signal generated by filter 62 is below the predetermined threshold magnitude, a smaller step size (e.g., 1 dB) may be employed, such that when gain control state machine 50 changes the selectable digital gain and the selectable analog gain, it does so in steps equal to the larger step size indicated by the signal STEP_SIZE.

Accordingly, when a condition occurs for initiating a change to the selectable digital gain and the selectable analog gain (e.g., output voltage signal $V_{OUT}$ increasing above a threshold magnitude, output voltage signal $V_{OUT}$ crossing a zero magnitude, output voltage signal $V_{OUT}$ increasing below a threshold magnitude and expiration of a duration of time after decreasing below the threshold magnitude, or any other condition for changing the selectable digital gain and the selectable analog gain), gain control state machine 50 may change each of the selectable digital gain and the selectable analog gain in steps in accordance with a step size based on the spectral content, as such spectral content is determined by control subcircuit 60.

In these and other embodiments, the spectral content of output voltage signal $V_{OUT}$ may be used to vary other parameters associated with changing the selectable digital gain and the selectable analog gain. For example, as described above, in some embodiments, gain control state machine 50 may change each of the selectable digital gain and the selectable analog gain based on a signal indicative of output voltage signal $V_{OUT}$ crossing a threshold magnitude (e.g., either from below to above the threshold magnitude or vice versa). In such embodiments, such threshold magnitude for changing each of the selectable digital gain and the selectable analog gain may be based on the spectral content of a signal indicative of output voltage signal $V_{OUT}$ (e.g., digital audio input signal DIG_IN). In other words, in such embodiments, comparator block 66 of FIG. 8 may be modified such that based on the signal output by level detection circuit 64, comparator block 66 would output a control signal setting a threshold magnitude for changing each of the selectable digital gain and the selectable analog gain. Accordingly, if sufficient signal energy is present within the pass band frequencies of filter 62, gain control state machine 50 may apply a first threshold magnitude as the condition for changing each of the selectable digital gain and the selectable analog gain, and if sufficient signal energy is not present within the pass band frequencies of filter 62, gain control state machine 50 may apply a second threshold magnitude as the condition for changing each of the selectable digital gain and the selectable analog gain.

In yet other embodiments, the spectral content of the signal indicative of output voltage signal $V_{OUT}$ may be used as a basis of whether to change the selectable digital gain and the selectable analog gain.

Although the foregoing description may contemplate that a threshold magnitude for switching a gain mode in response to a signal of increasing magnitude may be the same threshold magnitude for switching a gain mode in response to a signal of decreasing magnitude, it is understood that in some embodiments, a threshold magnitude for switching a gain mode in response to a signal of increasing magnitude may be a different threshold magnitude for switching a gain mode in response to a signal of decreasing magnitude.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An apparatus for providing an output signal to an audio transducer, comprising:
    a signal path comprising:
        an analog signal path portion having an audio input for receiving an analog signal, an audio output for providing an output signal, and a selectable analog gain, and configured to generate the output signal based on the analog signal and in conformity with the selectable analog gain; and
        a digital path portion having a selectable digital gain and configured to receive a digital input signal and convert the digital input signal into the analog signal in conformity with the selectable digital gain; and
    a control circuit configured to:
        determine a spectral content of a signal indicative of the output signal; and
        change the selectable digital gain and the selectable analog gain based on the spectral content.

2. The apparatus of claim 1, wherein the control circuit is further configured to, responsive to an existence of a condition for changing the selectable digital gain and the selectable analog gain, change each of the selectable digital gain and the selectable analog gain in steps in accordance with a step size based on the spectral content.

3. The apparatus of claim 2, wherein the condition for changing the selectable digital gain and the selectable analog gain is the output signal increasing above a threshold magnitude.

4. The apparatus of claim 2, wherein the condition for changing the selectable digital gain and the selectable analog gain is the output signal crossing a zero magnitude.

5. The apparatus of claim 2, wherein the condition for changing the selectable digital gain and the selectable analog gain is the output signal decreasing below a threshold magnitude and expiration of a duration of time after decreasing below the threshold magnitude.

6. The apparatus of claim 1, wherein the control circuit is further configured to, responsive to an existence of a condition for changing the selectable digital gain and the selectable analog gain and responsive to the spectral content having spectral components in a particular range of frequencies, change each of the selectable digital gain and the selectable analog gain.

7. The apparatus of claim 1, wherein the control circuit is further configured to, responsive to an existence of a condition for changing the selectable digital gain and the selectable analog gain, change each of the selectable digital gain and the selectable analog gain, wherein the condition comprises the output signal crossing a threshold magnitude, and wherein the threshold magnitude is based on the spectral content.

8. The apparatus of claim 1, wherein the control circuit is configured to determine the spectral content of the signal indicative of the output signal by applying a filter to the signal indicative of the output signal to generate a filtered signal and detecting a magnitude of the filtered signal.

9. The apparatus of claim 8, wherein the filter comprises a filter designed to mimic an auditory responsiveness of a human ear.

10. The apparatus of claim 8, wherein the filter comprises one of a low-pass filter, a bandpass filter, and a high-pass filter.

11. The apparatus of claim 1, wherein the selectable digital gain and the selectable analog gain are changed such that the product of selectable digital gain and the selectable analog gain is substantially the same before and after the change.

12. A method comprising:
    in a signal path comprising an analog signal path portion having an audio input for receiving an analog signal, an audio output for providing an output signal, and a selectable analog gain, and configured to generate the output signal based on the analog signal and in conformity with the selectable analog gain and further comprising a digital path portion having a selectable digital gain and configured to receive a digital input signal and convert the digital input signal into the analog signal in conformity with the selectable digital gain, determining a spectral content of a signal indicative of the output signal; and
    changing the selectable digital gain and the selectable analog gain based on the spectral content.

13. The method of claim 12, further comprising responsive to an existence of a condition for changing the selectable digital gain and the selectable analog gain, changing each of the selectable digital gain and the selectable analog gain in steps in accordance with a step size based on the spectral content.

14. The method of claim 13, wherein the condition for changing the selectable digital gain and the selectable analog gain is the output signal increasing above a threshold magnitude.

15. The method of claim 13, wherein the condition for changing the selectable digital gain and the selectable analog gain is the output signal crossing a zero magnitude.

16. The method of claim 13, wherein the condition for changing the selectable digital gain and the selectable analog gain is the output signal decreasing below a threshold magnitude and expiration of a duration of time after decreasing below the threshold magnitude.

17. The method of claim 12, further comprising responsive to an existence of a condition for changing the selectable digital gain and the selectable analog gain and responsive to the spectral content having spectral components in a particular range of frequencies, changing each of the selectable digital gain and the selectable analog gain.

18. The method of claim 12, further comprising responsive to an existence of a condition for changing the selectable digital gain and the selectable analog gain, changing each of the selectable digital gain and the selectable analog gain, wherein the condition comprises the output signal crossing a threshold magnitude, and wherein the threshold magnitude is based on the spectral content.

19. The method of claim 12, further comprising determining the spectral content of the signal indicative of the output signal by applying a filter to the signal indicative of the output signal to generate a filtered signal and detecting a magnitude of the filtered signal.

20. The method of claim 19, wherein the filter comprises a filter designed to mimic an auditory responsiveness of a human ear.

21. The method of claim 19, wherein the filter comprises one of a low-pass filter, a bandpass filter, and a high-pass filter.

22. The method of claim 12, wherein the selectable digital gain and the selectable analog gain are changed such that the product of selectable digital gain and the selectable analog gain is substantially the same before and after the change.

* * * * *